United States Patent
Nakayama et al.

[11] Patent Number: 5,847,506
[45] Date of Patent: Dec. 8, 1998

[54] ORGANIC LIGHT EMITTING DEVICE AND SUBSTRATE PLATE FOR IT

[75] Inventors: Takahiro Nakayama; Shintaro Hattori; Yuzo Ito, all of Hitachi; Atsushi Kakuta, Hitachioota, all of Japan

[73] Assignee: Hitachi, Ltd., Tokyo, Japan

[21] Appl. No.: 546,913

[22] Filed: Oct. 23, 1995

Related U.S. Application Data

[63] Continuation of Ser. No. 244,251, filed as PCT/JP93/01342 Sep. 20, 1993 published as WO94/07344 Mar. 3, 1994, abandoned.

[30] Foreign Application Priority Data

Sep. 22, 1992 [JP] Japan .................................. 4-252526
Mar. 18, 1993 [JP] Japan .................................. 5-059145

[51] Int. Cl.⁶ .............................. H05B 33/22; H01S 3/18
[52] U.S. Cl. ........................ 313/504; 313/506; 313/112; 313/113
[58] Field of Search .................................. 313/498, 501, 313/502, 504, 506, 112, 113

[56] References Cited

U.S. PATENT DOCUMENTS 5,085,947  2/1992  Saito et al. .............................. 313/504

FOREIGN PATENT DOCUMENTS

| | | |
|---|---|---|
| 1-130495 | 5/1989 | Japan . |
| 1-236672 | 9/1989 | Japan . |
| 2-46695 | 2/1990 | Japan . |
| 2-78279 | 3/1990 | Japan . |
| 3-186187 | 8/1991 | Japan . |
| 4-109589 | 4/1992 | Japan . |
| 4-237993 | 8/1992 | Japan . |

*Primary Examiner*—Nimeshkumar Patel
*Attorney, Agent, or Firm*—Antonelli, Terry, Stout, & Kraus

[57] ABSTRACT

An electro-luminescent conversion light emitting device for use in an information communication field. The light emitting device includes a semi-transparent reflective film substrate. On the semi-transparent reflective film is formed a transparent conductive film. On the transparent conductive film is formed a light emitting layer of organic thin film on the transparent conductive film. On the light emitting layer is formed an electrode. The semi-transparent reflective film 2 transmits parts of the light emitted by the light emitting layer to the glass substrate and reflects parts of the light to the light emitting layer. The semi-transparent reflective film acts as a light resonator with the Ag-Mg metal electrode on back of the light emitting layer.

12 Claims, 4 Drawing Sheets

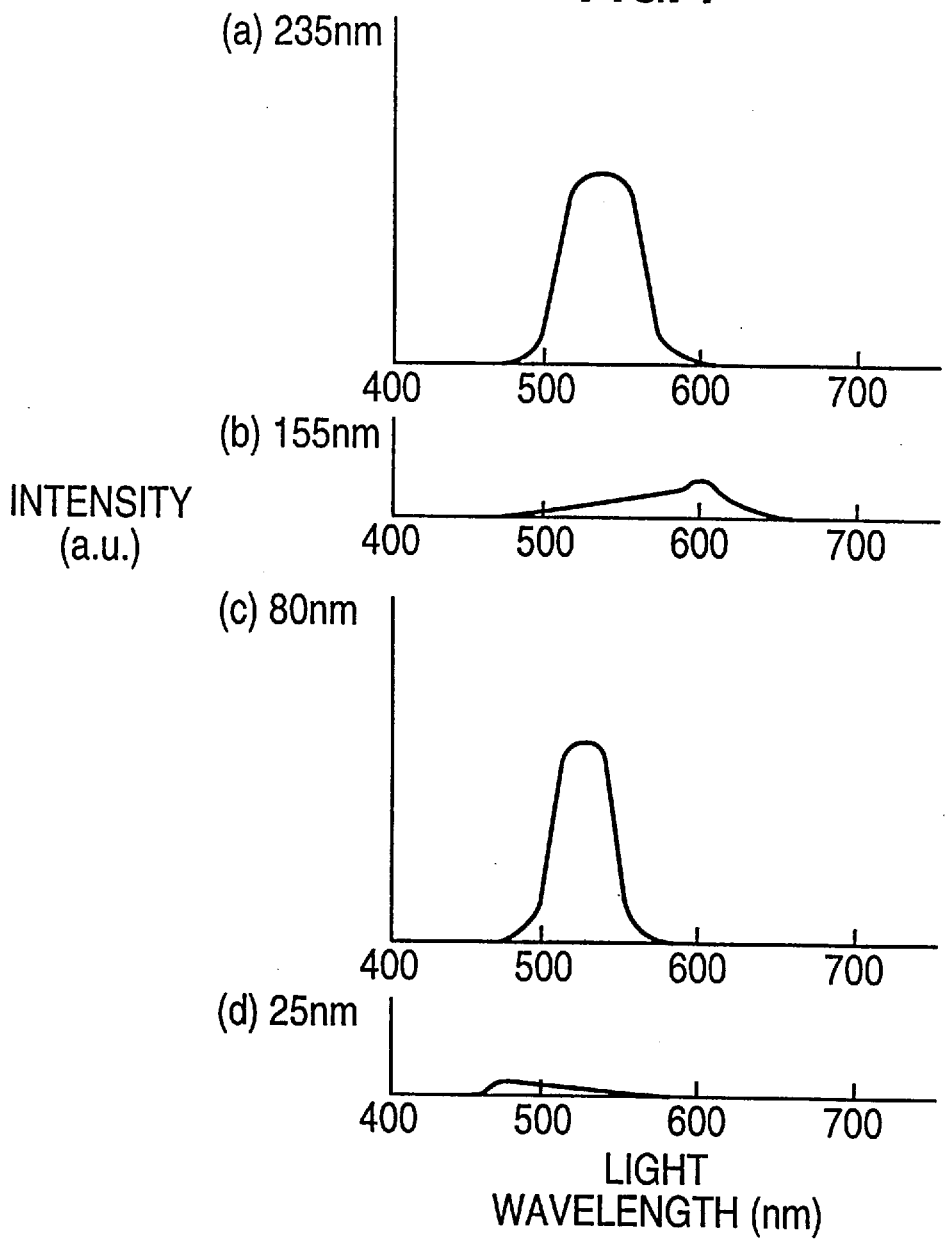

ORGANIC LIGHT EMITTING DEVICE AND SUBSTRATE PLATE FOR IT

This application is a continuation application of Ser. No. 08/244,251, filed May 20, 1994, now abandoned.

BACKGROUND OF THE INVENTION

1. Field of the Invention

The present invention relates to an organic light emitting device available for display devices, light emitting devices for communications, information file reading/writing heads, printing apparatuses, and similar devices and apparatuses and to a substrate plate used for it.

2. Description of the Prior Art

Previously proposed organic light emitting devices include, for example, an organic electro-luminescent cell disclosed in the Japanese Patent Application Laid-Open No. 57-51781. The cell has a light emitting body of organic light emitting material and electrically insulating binder Interposed between transparent substrates having transparent electrodes of indium tin oxide or the like and a compound layer of porphyrin system is formed between a positive one of the transparent electrodes and the light emitting body. The organic electro-luminescent cell has a hole injecting body of a compound of porphyrin system to inject holes on the basis of a signal voltage applied between the both electrodes to emit light.

Such light emitting devices having the organic thin film used therein are advantageous in fabrication at low cost. However, their use is limited to display panels as their half-widths of spectra are too wide. They also is available only for a single color of display as the specific material can emit only one color of light.

OBJECT AND ADVANTAGES

In view of solving the foregoing problems of the prior arts, it is an object of the present invention to provide an organic light emitting device having improved spectra width and light emitting characteristics.

Another object of the present invention is to provide a substrate plate used for an organic light emitting device.

SUMMARY OF THE INVENTION

Briefly, the foregoing object is accomplished in accordance with aspects of the present invention by an organic light emitting device and a substrate plate used for it. The present invention features:

(1) An organic light emitting device, successively comprising a micro-resonator formed of a light emitting layer of organic thin film having a light emitting feature and reflective mirrors each of which is put on a surface of the light emitting layer, wherein the micro-resonator is devised to be capable of emitting a light.

(2) An organic light emitting device, successively comprising a transparent substrate, a semi-transparent reflective layer put on the transparent substrate, a transparent conductive layer put on the semi-transparent reflective layer, a light emitting layer of organic thin film put on the transparent conductive layer, and an electrode formed on the light emitting layer, wherein the semi-transparent reflective layer is made to transmit parts of the light emitted by the light emitting layer to the transparent substrate and to reflect parts of the light to the light emitting layer, and the semi-transparent reflective layer and the electrode on back of the light emitting layer are arranged together to act as an optical resonator.

(3) An organic light emitting device, successively comprising a transparent substrate, a semi-transparent reflective layer put on the transparent substrate, a transparent conductive layer put on the semi-transparent reflective layer, a hole injecting layer put on the transparent conductive layer, a light emitting layer formed of organic thin film put thereon, an electron injecting layer put thereon, and an electrode formed thereon, wherein the semi-transparent reflective layer is made to transmit parts of the light emitted by the light emitting layer to the transparent substrate and to reflect parts of the light to the light emitting layer, and the semi-transparent reflective layer and the electrode on back of the light emitting layer are arranged together to act as an optical resonator.

(4) The organic light emitting device described above, wherein an optical distance denoted by L between the semi-transparent reflective layer and the electrode on back of the light emitting layer is given by an expression of $$L = (\text{integer} - A/\pi) \times (\text{peak wavelength of light to be taken out})/2,$$

provided
$$S < 2L < T$$

where A is shift of phase of the light reflected between the semi-transparent reflective layer and the electrode on back of the light emitting layer in radian, and S and T are wavelengths at which an intensity of the emitted light in a range of light emission spectra of a light emitting device having no semi-transparent reflective layer is one half of a peak intensity of the emitted light.

(5) The organic light emitting device described above, wherein an optical distance denoted by L between the semi-transparent reflective layer and the an electrode on back of the light emitting layer is $$L = (0.9 \text{ to } 1.1) \times (\text{peak wavelength of light to be taken out}) \times (\text{integer} - A/2\pi)/2$$

where A is shift of phase of the light reflected between the semi-transparent reflective layer and the electrodes on back of the light emitting layer in radian.

Also, similar effects of resonance can be obtained if the optical distance is multiplied by an integer, such as two times, three times, or multiplied by a half-integer, such as 1/2 times, 3/2 times.

(6) The organic light emitting device described above, wherein the semi-transparent reflective layer is formed of multi-film of dielectric material.

(7) The organic light emitting device described above, wherein sum of optical distances given in terms of products of thicknesses of the transparent conductive layer, the hole injecting layer, the light emitting layer, and the electron injecting layer multiplied by their respective refractive indexes is made equal or approximate to a peak wavelength of the emitted light.

(8) The organic light emitting device described above, wherein the semi-transparent reflective layer is formed of a total metal reflective film having a window opened for passing the emitted light out.

(9) The organic light emitting device described above, wherein a reflectance of the semi-transparent reflective layer is 50 to 99.9% or a transmittance thereof is 50 to 0.1%.

(10) A substrate plate for organic light emitting device, comprising a transparent substrate plate and a semi-transparent reflective layer of multi-film of dielectric material capable of transmitting parts of a light and reflecting parts of the light put on the transparent substrate plate, wherein a transparent conductive film is put on the semi-transparent reflective layer. (11) A substrate plate for organic light emitting device, comprising a transparent substrate plate, a semi-transparent reflective layer of multi-film of dielectric material put on the transparent substrate plate, and a transparent conductive film put on the semi-transparent reflective layer, wherein a reflectance of the semi-transparent reflective layer is 50 to 99.9% or a transmittance thereof is 50 to 0.1%.

(12)The substrate plate described above should be preferably formed of quartz, glass, or plastics and the transparent conductive film is patterned on the semi-transparent reflective layer.

In the organic light emitting device of the present invention, the light micro-resonator can be accomplished therein in the way that the semi-transparent reflective film is place between the transparent electrode and the substrate plate and the optical distance between the reflective film and the rear electrode is made equal to or an integer multiplication of the emitted light wavelength. The micro-resonator can make narrow the half-width of the emitted light spectra. Also, the micro-resonator can increase the light emission efficiency, generate the coherent light, and improve the light emission characteristics.

DETAILED DESCRIPTION OF THE PREFERRED EMBODIMENT

The following describes in detail embodiments according to the present invention by reference to the accompanying drawings.

Embodiment 1

Figure 1:
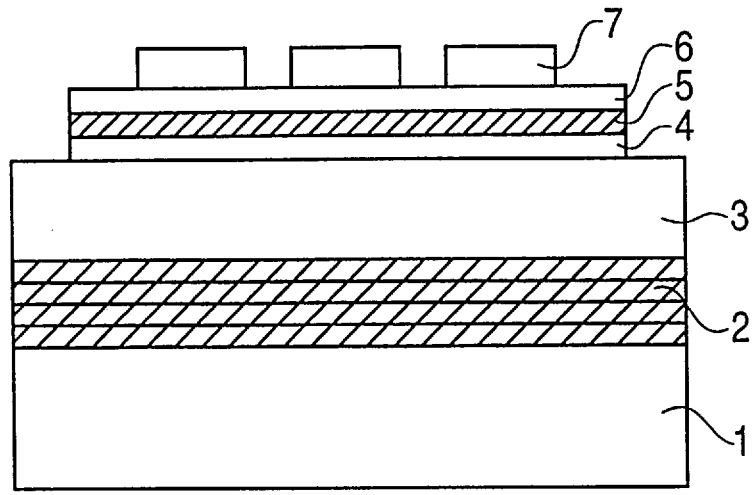
FIG. 1 is a cross-sectional structure illustrating an organic light emitting device in a first embodiment of the present invention.

FIG. 1 depicts a cross-sectional structure illustrating an organic light emitting device in a first embodiment of the present invention.

The organic light emitting device has a glass substrate 1. The glass substrate 1 has a semi-transparent reflective film 2 laminated of a $TiO_2$ film and a $SiO_2$ film. On the semi-transparent reflective film 2 is formed a transparent conductive film 3 of indium tin oxide abbreviated ITO, a hole injecting layer 4 of triphenyl diamine derivative (TAD), a light emitting layer 5 of aluminum chelate compound, an electron injecting layer 6 of oxydiazole derivative (PBD), and an electrode 7 of Ag-Mg successively. Sum of optical distances obtained in terms of products of thicknesses of the transparent conductive film 3, the hole injecting layer 4, the light emitting layer 5, and electron injecting layer 6 multiplied by their respective refractive indexes should be made to coincide with 530 nm which is a peak wavelength at which the aluminum chelate compound makes electroluminescent (EL) light emission, This enables the resonator of present invention to function.

The hole injecting layer 4 and the electron injecting layer 6 as shown in FIG. 1 is not always needed if high performance characteristics are not required. The organic light emitting device can be used without either or both of them. With the omission, holes are injected from the transparent conductive film 3, and further electrons are injected from the metal electrode 7 thereby completing the organic light emitting device. The device, however, should preferably have the hole injecting layer 4 and the electron injecting layer 6 provided therein.

Reflectance of the semi-transparent reflective film 2 should be selected with respect to performance characteristics of the light emitting layer 5 and application of the device. An upper limit of the device is restricted in terms of the energy that a light resonator can store without self-destruction. The reflectance is 50 to 99.9% while transmissivity of the semi-transparent reflective film 2 is 50 to 0.1%. To obtain an light emission of at least 10 $\mu mW/cm^2$, the transmissivity of the light to be fed out cannot be made lower than 0.1%. The reflectance is limited to 99.9%. If the reflectance is made too low, the light resonator cannot function. If it is lower than 50%, the spectra width cannot be made sufficiently narrow.

The above-mentioned aluminum chelate compound used for the light emitting layer 5 may be alternatively replaced by perylene derivative, perinone derivative, naphthalene derivative, coumarin derivative, oxadiazole, bisbensoxazoline, aldazine, pyrazine derivative, distilbenzine derivative, polyphenyl derivative, bisstilanthracene derivative, and chelate metal complex.

Any of the above-mentioned organic thin films can be formed by way of evaporation, coating, growing by chemical reaction, the Langmuir project method, or similar techniques. The thin films also can be formed of adequate mixtures of a plurality of organic materials.

Figure 2:
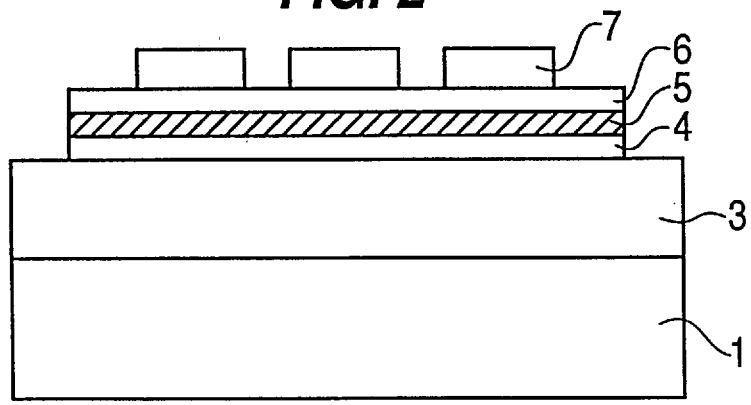
FIG. 2 is a cross-sectional structure illustrating a previous organic electroluminescent (EL) light emitting device.

FIG. 2 depicts a cross-sectional structure illustrating a previous organic electroluminescent (EL) light emitting device. This previous device is formed with the semi-transparent reflective film 2 removed from the structure shown in FIG. 1.

Figure 3:
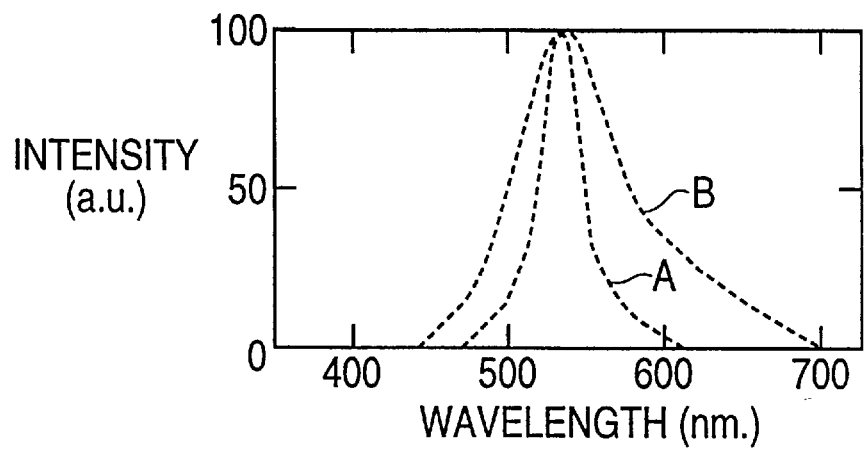
FIG. 3 is a comparison graph illustrating light emission spectra of the devices in FIGS. 1 and 2.

FIG. 3 depicts a comparison graph illustrating light emission spectra of the devices in FIGS. 1 and 2. We can see that a spectra curve A of the device of the present invention in FIG. 1 has narrower half-width than the previous device in FIG. 2. This is due to the fact that the semi-transparent reflective film 2 makes resonance of light emission in the device to generate an electromagnetic wave of a resonant frequency selectively. Such a light emission resonance provides effects that make narrow the half-width of the light emission spectra, increase a light emission efficiency, and generate an coherent light. The effects can be further increased by make the optical distance of a resonating portion of the resonator rather close to the light emission wavelength.

Figure 4:
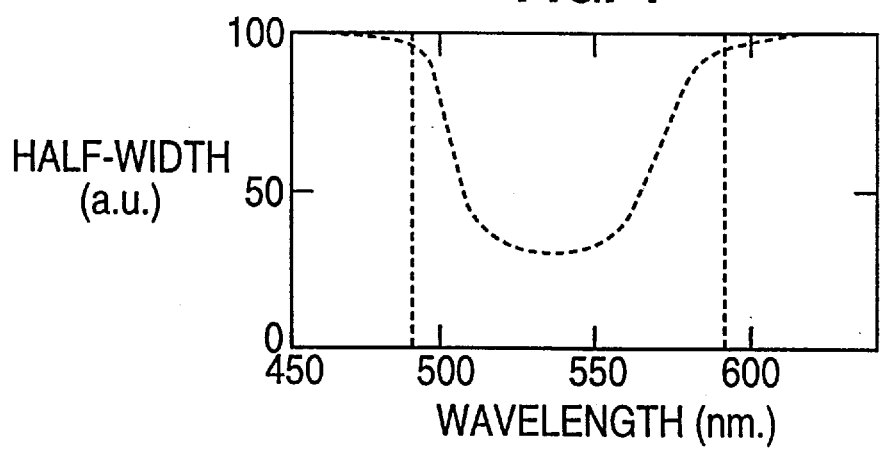
FIG. 4 is a graph illustrating a curve of the half-width of light emission spectra with respect to a resonating portion of a resonator of a light emitting device having a semi-transparent reflective film of the embodiment of the present invention.
Figure 5:
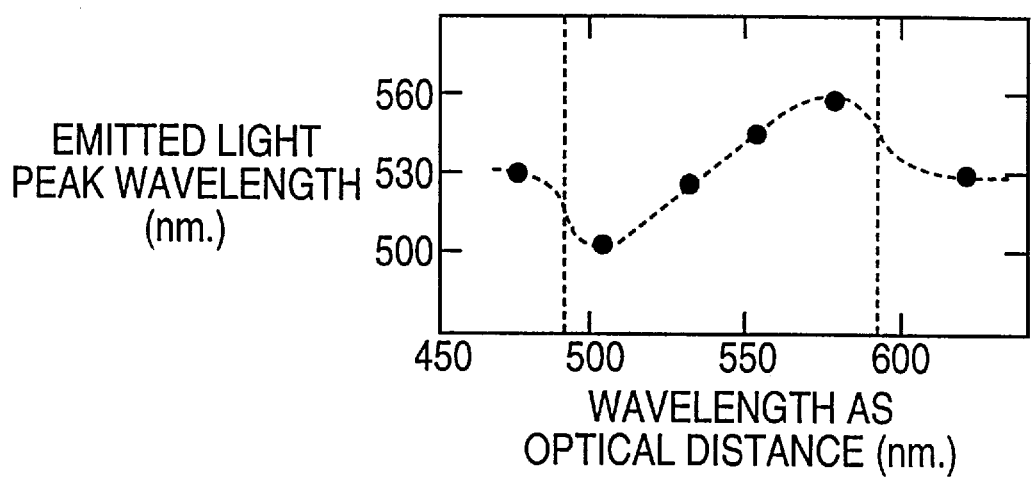
FIG. 5 is a graph illustrating a curve of optical distance of the resonator with respect to a peak wavelength of the light emitted out of the device having the semi-transparent reflective film.

FIG. 4 depicts a graph illustrating a curve of the half-width of the light emission spectra with respect to the resonating portion of the resonator. The curve is the results obtained by a measurement of the device with only a thickness of the hole injecting layer 4 changed in the device structure in FIG. 1. In the graph, the half-width without the semi-transparent reflective film 2 is 100%. We can see that the half-width is least around 530 nm at which the optical distance coincides with the peak wavelength, and becomes wide quickly as the wavelength is apart from 530 nm. We can also see from curve B in FIG. 3 that the device having no semi-transparent reflective film 2 has wavelengths of 480 and 580 nm when the light emission intensity is a half of that at 530 nm. This range corresponds to the one in which the half-width in FIG. 4 is made narrow. FIG. 5 depicts a graph illustrating a curve of the optical distance of the resonator with respect to the peak wavelength of the light emitted out of the device having the semi-transparent reflective film 2. The resonance provides an effect of phenomenon that if the optical distance is deviated from 530 nm, the peak wavelength of the emitted light also is deviated from 530 nm. If the deviation is too large to cause light emission due to resonance, the peak of the whole light emission becomes close to the peak wavelength of 530 nm when the semi-transparent reflective film 2 is not provided.

We can see from the results in FIG. 5 that the resonance effect can be obtained when the optical distance is in a range of 0.9 to 1.1 times the peak wavelength of the emitted light. This range corresponds to the one in which the half-width in FIG. 4 is made narrow.

The aluminum chelate used as the material for the light emitting layer in the first embodiment may be alternatively replaced by not only compounds similar to that, but also any of mixtures, laminated layers, and similar organic materials that can emit light by way of electron-hole coupling.

It is important that the device should have an arrangement to keep the device temperature constant to stabilize the resonated light emission.

Optimum transmissivity and reflectance may vary depending on the device structure and the material forming the semi-transparent reflective film 2, but the absorptance should be preferably as close as to 0.

The semi-transparent reflective film 2 may be preferably replaced by a total metal reflective film having patterning processed and having a window opened partly for passing light out. Also, the device may be structure so hard to leak light laterally to increase the light emission characteristics further.

As described so far, embodiment 1 has the optical distance as resonator made to equal to the light emission wavelength. The embodiment, also, can theoretically provide similar effects of resonance if the optical distance is times of integers, such as two times, three times, . . . , n times of the light emission wavelength, and if the optical distance is times of half-integers, such as 1/2 times, 3/2 times, . . . , n/2 times of the light emission wavelength.

Also, embodiment 1 has the total light phase shift made 0 or 1 wavelength by reflections on the upper and lower mirror surfaces. The embodiment, also, can make resonance for devices having the light shifted 1/2 wavelength on the metal electrode surface and not shifted on the semi-transparent reflecting mirror if the optical length is made 1/4, 3/4, 5/4, and so on times of the light emission wavelength.

However, actual devices are involved in blunt sharpness of resonance due to fabrication of the devices themselves, The above-mentioned resonance effects therefore are keen as the film is thin, and the resonance is unclear as the number of times is large. For the reason, a practical number of times is limited to 10.

The device of structure in embodiment 1 make use of field light emission by electric charge injection and also, can be modified to have a transparent substrate plate to irradiate a light to make the light emitting layer generate a fluorescent light, thereby producing spectra of light emission of narrow half-width similar to that of the field light emission. In such modified example, it is possible for the device to omit the transparent electrode and the organic thin films other than the light emitting layer.

Embodiment 2

Figure 6:
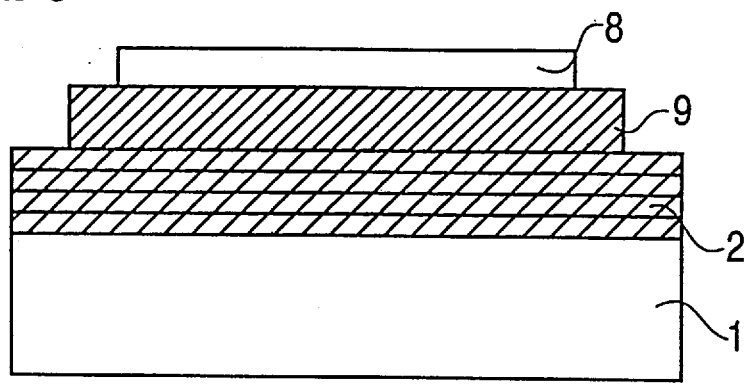
FIG. 6 is a cross-sectional structure illustrating a resonator device of emitting light by light excitation in a second embodiment of the present invention; and, FIG. 7 is a graph illustrating light emission spectra of the device with respect to thickness of an organic fluorescent film of aluminum chelate compound.

FIG. 6 depicts a cross-sectional structure illustrating a resonator device of emitting light by light excitation in a second embodiment of the present invention.

The resonator device has an organic fluorescent thin film 9 of aluminum chelate compound put between a total reflective metal film 8 and a semi-transparent reflective film 2 laminated of a $TiO_2$ film and a $SiO_2$ film. A light of 406 nm wavelength is irradiated from the outside of the transparent substrates plate 1 to make the organic fluorescent thin film 9 emit a visible light.

FIG. 7 depicts a graph illustrating light emission spectra of the device with respect to thickness of the organic fluorescent thin film 9 of aluminum chelate compound. The thickness of the organic fluorescent thin film 9 of aluminum chelate compound can be changed to adjust position, half-width, and intensity of a peak of the emitted visible light. Also, a reflective characteristic of the semi-transparent reflective film 2 can be changed to adjust a form of the light emission spectra.

As described so far, the organic light emitting devices of the present invention provide such effects of light resonator as increasing the light emitting characteristics, including making narrow the half-width of light emission spectra, increasing the light emission efficiency, and generating the coherent light.

The organic light emitting devices of the present invention can alternatively replace the previous light emitting diodes and semiconductor lasers formed of GaAs, SiC, ZnSe, and similar inorganic semiconductors. They are available for optical communication devices, information display panels, reading/writing heads for optical record file, and optical heads for laser printer.

What is claimed is:

1. An organic light emitting device, successively comprising a transparent substrate, a semi-transparent reflective layer on the transparent substrate, a transparent conductive layer serving as a first electrode on the semi-transparent reflective layer, a light emitting layer of organic thin film on the transparent conductive layer, and a second electrode serving as a reflective mirror formed on the light emitting layer, wherein the semi-transparent reflective layer is made to transmit parts of the light emitted by the light emitting layer to the transparent substrate and to reflect parts of the light to the light emitting layer, and the semi-transparent reflective layer and the second electrode on back of the light emitting layer are arranged together to act as an optical micro-resonator.

2. The organic light emitting device according to claim 1, wherein an optical distance between the semi-transparent reflective layer and the second electrode on back of the light emitting layer is (0.9 to 1.1)n times a peak wavelength of a light to be taken out, wherein n is a positive integer.

3. The organic light emitting device according to claim 1, wherein the semi-transparent reflective layer is formed of multi-film of dielectric material.

4. The organic light emitting device according to claim 1, wherein the semi-transparent reflective layer is formed of a total metal reflective film having a window opened for passing the emitted light out.

5. The organic light emitting device according to claim 1, wherein a reflectance of the semi-transparent reflective layer is 50 to 99.9% or a transmittance thereof is 50 to 0.1%.

6. An organic light emitting device, successively comprising a transparent substrate, a semi-transparent reflective layer on the transparent substrate, a transparent conductive layer serving as a first electrode on the semi-transparent reflective layer, a hole injecting layer on the transparent conductive layer, a light emitting layer formed of organic thin film on the hole injecting layer, an electron injecting layer on the light emitting layer, and a second electrode serving as a reflective mirror formed on the electron injecting layer, wherein the semi-transparent reflective layer is made to transmit parts of the light emitted by the light emitting layer to the transparent substrate and to reflect parts of the light to the light emitting layer, and the semi-transparent reflective layer and the second electrode on the back of the light emitting layer are arranged together to act as an optical micro-resonator.

7. The organic light emitting device according to claim 6, wherein sum of optical distances given in terms of products of thicknesses of the transparent conductive layer, the hole injecting layer, the light emitting layer, and the electron injecting layer multiplied by their respective refractive indexes is made equal or approximate to a peak wavelength of the emitted light.

8. An organic light emitting device, successively comprising a transparent substrate, a semi-transparent reflective layer on the transparent substrate, a transparent conductive layer serving as a first electrode on the semi-transparent reflective layer, a hole injecting layer on the transparent conductive layer, a light emitting layer formed of organic thin film on the hole injecting layer, and second electrode serving as a reflective mirror formed on the light emitting layer, wherein the semi-transparent reflective layer is made to transmit parts of the light emitted by the light emitting layer to the transparent substrate and to reflect parts of the light to the light emitting layer, and the semi-transparent reflective layer and the second electrode on back of the light emitting layer are arranged together to act as an optical micro-resonator.

9. An organic light emitting device, successively comprising a transparent substrate, a semi-transparent reflective layer on the transparent substrate, a transparent conductive layer serving as a first electrode on the semi-transparent reflective layer, a light emitting layer formed of organic thin film on the transparent conductive layer, an electron injecting layer on the light emitting layer, and a second electrode serving as a reflective mirror formed on the electron injecting layer, wherein the semi-transparent reflective layer is made to transmit parts of the light emitted by the light emitting layer to the transparent substrate and to reflect parts of the light to the light emitting layer, and the semi-transparent reflective layer and the second electrode on the back of the light emitting layer are arranged together to act as an optical micro-resonator.

10. A substrate plate for an organic light emitting device, comprising a transparent substrate, a semi-transparent reflective layer of multi-film of dielectric material capable of transmitting parts of a light and reflecting parts of the light on the transparent substrate plate and a transparent conductive film serving as an electrode on the semi-transparent reflective layer.

11. The substrate plate for organic light emitting device according to claim 10, wherein the transparent substrate plate is formed of quartz, glass, or plastics and the transparent conductive film serving as an electrode is patterned on the semi-transparent reflective layer.

12. A substrate plate for an organic light emitting device, comprising a transparent substrate, a semi-transparent reflective layer of multi-film of dielectric material put on the transparent substrate plate, and a transparent conductive film serving as an electrode on the semi-transparent reflective layer, wherein a reflectance of the semi-transparent reflective layer is 50 to 99.9% or a transmittance thereof is 50 to 0.1%.

\* \* \* \* \*